(12) United States Patent
Yugami et al.

(10) Patent No.: US 7,064,400 B2
(45) Date of Patent: Jun. 20, 2006

(54) SEMICONDUCTOR DEVICE AND PROCESS FOR PRODUCING THE SAME

(75) Inventors: Jiro Yugami, Yokohama (JP); Natsuki Yokoyama, Mitaka (JP); Toshiyuki Mine, Fussa (JP); Yasushi Goto, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 113 days.

(21) Appl. No.: 11/000,992

(22) Filed: Dec. 2, 2004

(65) Prior Publication Data

US 2005/0104141 A1 May 19, 2005

Related U.S. Application Data

(60) Continuation of application No. 10/776,215, filed on Feb. 12, 2004, now Pat. No. 6,833,296, which is a division of application No. 10/005,355, filed on Dec. 7, 2001, now Pat. No. 6,710,383.

(30) Foreign Application Priority Data

Dec. 11, 2001 (JP) .............................. 2000-375610

(51) Int. Cl.
*H01L 29/76* (2006.01)
(52) U.S. Cl. ..................................... 257/411
(58) Field of Classification Search ................ 257/213, 257/288, 368, 410, 411
See application file for complete search history.

(56) References Cited

U.S. PATENT DOCUMENTS 5,514,891 A 5/1996 Abrokwah et al.
6,002,150 A * 12/1999 Gardner et al. .............. 257/310
6,495,890 B1 12/2002 Ono
6,614,081 B1 * 9/2003 Makabe et al. .............. 257/410

* cited by examiner

FOREIGN PATENT DOCUMENTS

JP 110003990 1/1999

OTHER PUBLICATIONS

1998 International Electron Electron Device Meeting Technical Digest, (pp. 1038-1040), A 1.1 nm Oxide Equivalent Gate Insulator Formed Using TiO2 on Nitrided Silicon.
IEEE Transactions on Electron Devices, vol. 46, No. 7, Jul. 1999, (pp. 1537-1544), The Impact of High-k Gate Dielectrics and Metal Gate Electrodes on Sub-100 nm MOSFET's.

*Primary Examiner*—Scott Geyer
(74) *Attorney, Agent, or Firm*—Antonelli, Terry, Stout and Kraus, LLP.

(57) ABSTRACT

There is provided a semiconductor device configured as follows. On a semiconductor substrate, a titanium oxide film which is an insulating film having a higher dielectric constant than that of a silicon dioxide film is formed as a gate insulating film, and a gate electrode is disposed thereon, resulting in a field effect transistor. The end portions in the gate length direction of the titanium oxide film are positioned inwardly from the respective end portions on the source side and on the drain side of the gate electrode, and the end portions of the titanium oxide film are positioned in a region in which the gate electrode overlaps with the source region and the drain region in plan configuration. This semiconductor device operates at a high speed, and is excellent in short channel characteristics and driving current. Further, in the semiconductor device, the amount of metallic elements introduced into a silicon substrate is small.

5 Claims, 7 Drawing Sheets

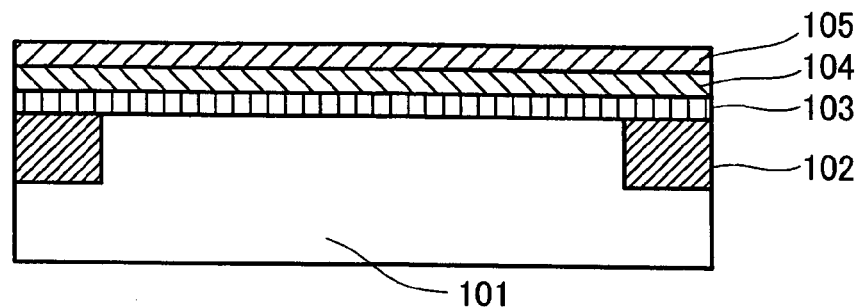
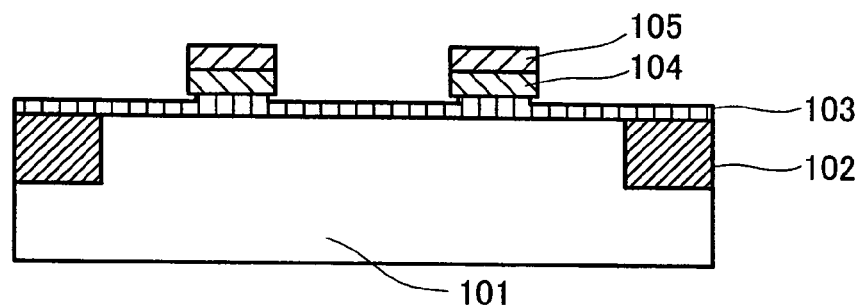
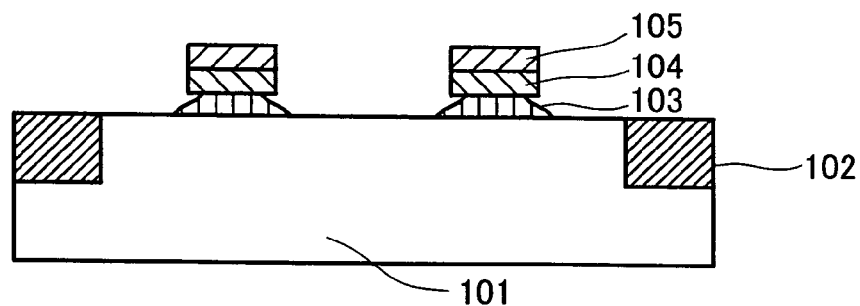
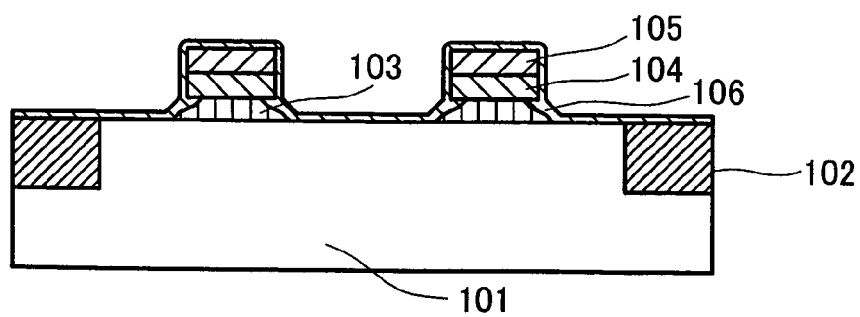

US 7,064,400 B2

SEMICONDUCTOR DEVICE AND PROCESS FOR PRODUCING THE SAME

CROSS-REFERENCE TO RELATED APPLICATIONS

This application is a Continuation of application Ser. No. 10/776,215, filed Feb. 12, 2004 now U.S. Pat. No. 6,833,296 which is a Divisional of application Ser. No. 10/005,355, filed Dec. 7, 2001, now U.S. Pat. No. 6,710,383 the entire disclosures of which are hereby incorporated by reference.

BACKGROUND OF THE INVENTION

1. Field of the Invention

The present invention relates to a semiconductor device, and a manufacturing method thereof. More particularly, it relates to a semiconductor device having a MISFET in which an insulating film having a higher dielectric constant than that of a conventional silicon dioxide film is used as a gate insulating film, and a manufacturing method thereof.

2. Description of the Related Art

The technical development in a semiconductor device has been pursued from three viewpoints of an increase in integration, a reduction in electric power consumption, and an increase in speed. Out of these, the reduction in electric power consumption and the increase in speed in the MISFET are the mutually contradictory challenges. For achieving the compatibility therebetween, the reduction in thickness of a gate insulating film exceeding the trend in the prior art has been required. On the other hand, a silicon dioxide film which has been used as a gate insulating film in the prior art has advantages in that it is excellent in interface characteristics with a silicon substrate, and in that it has a large band gap as an insulating film. However, it has a dielectric constant of 3.8 to 3.9. Thus, the film thickness is required to be set at around 3 nm even for meeting the current requirements on the device performances. The film thickness of the insulating film is determined by a necessary channel induced charge amount. The channel induced charge amount Qc is expressed as the following equation:

$$Qc = V \cdot \in_0 \cdot \in / t \, (q/cm^2)$$

where t denotes the gate insulating film thickness, $\in$ denotes the dielectric constant, $\in_0$ denotes the dielectric constant of vacuum, and V denotes the voltage applied to the gate insulating film. If the insulating film is reduced in film thickness down to 3 nm or less, there is observed a current (direct tunnel current) which flows by directly tunneling in the insulating film between a gate electrode and the silicon substrate. This current is very large. For this reason, it is considered difficult to reduce the film thickness more than now with the silicon dioxide film.

For avoiding this problem, the use of an insulating film having a large dielectric constant $\in$ is effective. The reason for this is that the Qc is proportional to $\in$, and inversely proportional to the film thickness t as apparent from the equation shown above. As the insulating film having a large dielectric constant $\in$, there is known an oxide film of titanium, tantalum, hafnium, zirconium, aluminium, lanthanum, strontium, selenium, or the like. For example, in the paper issued to B. He et al., (1998 International Electron Device Meeting Technical Digest, p.p. 1038–1040), there is described the characteristic of a MIS (metal insulator silicon) structure using a titanium oxide film. There is also described that even an insulating film with a film thickness of 1.1 nm (EOT; Equivalent Oxide Thickness) in terms of the dielectric constant of a silicon dioxide film can also inhibit the direct tunnel current.

Further, in JP-A No. Hei 11-3990, there is described as follows. When a high dielectric constant material is used as a gate insulating film, an increase in gate electric field increases the current leakage, and thereby deteriorates the element characteristics. Further, the overlap between the gate electric field and the drain electric field causes the short channel effect. For avoiding the foregoing problems, there is disclosed the following semiconductor device. In this semiconductor device, a gate insulating film is formed with a shorter length in the gate length direction than that of a gate electrode. A space or a dielectric having a lower dielectric constant than that of the gate insulating film is provided laterally in the gate length direction of the gate insulating film, and in the region, which is sandwiched between the gate electrode and a semiconductor substrate, and in which at least the gate electrode and a diffusion layer overlap on each other as seen from the top.

As described in the paper to B. He et al., when an insulating film having a high dielectric constant such as a titanium oxide film is used, even if the EOT is reduced to 1 nm or less, the physical film thickness of the insulating film is sufficiently large. Therefore, it is possible to inhibit the direct tunnel current. However, this technology has given no consideration to the following fact. Namely, the insulating film having a high dielectric constant is a metal oxide of titanium, tantalum, or the like. Accordingly, incorporation of such a metal into the silicon substrate causes an increase in junction leakage, and the like. In a conventional MISFET formation process, in general, the gate insulating film is left at the time of gate electrode processing, and source and drain regions are formed with an ion implantation method by using this film as a through film for ion implantation. However, if metallic elements are contained in the gate insulating film at this step, it is unavoidable that the metallic elements are introduced into the silicon substrate due to the knock-on effect.

Further, the paper of (IEEE Transaction on Electron Devices, volume 46, No. 7, July 1999, PP. 1537 to 1544) to B. Cheng., et al., indicates as follows. Namely, when a high dielectric constant insulating film is used as a gate insulating film, the device performances are reduced by the fringe effect due to an increase in the capacitance (fringe capacitance) between the gate edge and the source/drain.

Still further, the foregoing prior art described in JP-A No. Hei 11-3990 has given no consideration to the following fact. Namely, in the region in which the gate electrode and the diffusion layer overlap on each other as seen from the top, a space or a dielectric having a lower dielectric constant than that of a gate insulating film is present. Further, no gate insulating film is disposed on top of the diffusion layer. Therefore, it is difficult to achieve a higher speed.

SUMMARY OF THE INVENTION

A first object of the present invention is to provide a semiconductor device in which an insulating film having a higher dielectric constant than that of a silicon dioxide is used as a gate insulating film, and which operates at a high speed, and is excellent in short channel characteristics, and driving current, and in which the amount of metallic elements introduced into a silicon substrate is small.

A second object of the present invention is to provide a method for manufacturing a semiconductor device in which an insulating film having a higher dielectric constant than that of a silicon dioxide is used as a gate insulating film, and which operates at a high speed, and is excellent in short channel characteristics, and driving current, and in which the amount of metallic elements introduced into a silicon substrate is small.

In order to attain the first object, a semiconductor device according to one aspect of the present invention has a field effect transistor which includes a semiconductor substrate, a gate insulating film on the semiconductor substrate, and a gate electrode disposed via the gate insulating film on the semiconductor substrate, wherein the gate insulating film is an insulating film having a higher dielectric constant than that of a silicon dioxide film, the end portions in the gate length direction of the gate insulating film are positioned inwardly from the respective end portions on the source side and on the drain side of the gate electrode, and the end portions of the gate insulating film are positioned in a region in which the gate electrode overlaps with a source region and a drain region in plan configuration.

Further, in order to attain the first object, a semiconductor device according to another aspect of the present invention has a field effect transistor which includes a semiconductor substrate, a gate insulating film on the semiconductor substrate, and a gate electrode disposed via the gate insulating film on the semiconductor substrate, wherein the gate insulating film is an insulating film having a higher dielectric constant than that of a silicon dioxide film, and the end portions in the gate length direction thereof are positioned inwardly from the respective end portions on the source side and on the drain side of the gate electrode, and a source region and a drain region of the field effect transistor extend into the underlying portion of the gate insulating film.

In either of the semiconductor devices, the end portions of the gate insulating film are respectively the end portions of the site which is largest in thickness. In other words, when the gate insulating film is made of a plurality of layers, and the positions of respective end portions thereof differ from one another, the inside between the portions positioned most inwardly from the end portions of the gate electrode corresponds to the thickest site of the gate insulating film. Accordingly, the portions are respectively the end portions of the gate insulating film. Further, even when the end portions of the gate insulating film are not perpendicular to the substrate, the portions positioned most inwardly from the end portions of the gate electrode are respectively the end portions thereof.

It is preferable that the end portions in the gate length direction of the gate insulating film are positioned inwardly from the respective end portions on the source side and on the drain side of the gate electrode by 15 nm to 25 nm, respectively.

It is preferable that as the gate insulating film, the oxide, the oxynitride, the silicate compound, or the like of at least one metal selected from the group consisting of titanium, tantalum, hafnium, zirconium, aluminium, lanthanum, and strontium is used. Herein, the silicate compound is defined as a compound having a structure in which the oxide of the metal is contained in the dioxide of silicon ($SiO_2$). Further, the dielectric constant of the gate insulating film is preferably up to about 300. The reason for this is as follows: if it exceeds 300, the film thickness of the gate insulating film becomes too large.

When the gate insulating film is made of a plurality of layers, it is possible to adopt a laminated structure in which a layer comprising the oxide of at least one metal selected from the group consisting of titanium, tantalum, hafnium, zirconium, aluminium, lanthanum, and strontium, and under this layer, a layer comprising the silicate compound of the metal are provided.

It is preferable that the source region and the drain region do not contain the metal contained in the insulating film, or contain the metal in a concentration of $10^{11}$ atom/$cm^2$ or less. The gate electrode is preferably a metal selected from at least one selected from the group consisting of tungsten, titanium, and molybdenum, or a nitride thereof or a silicide thereof.

Further, in order to attain the second object, a method for manufacturing a semiconductor device according to one aspect of the present invention, includes the steps of: forming an insulating film having a higher dielectric constant than that of a silicon dioxide film on a semiconductor substrate, and forming a conductive film on the insulating film; processing the conductive film into a gate electrode; removing the insulating film having a higher dielectric constant so that the part underlying the gate electrode is left, and the end portions of the residual part are positioned inwardly of the end portion on the side on which a source region is to be formed and the end portion on the side on which a drain region is to be formed of the gate electrode, and thereby allowing the residual part to serve as a gate insulating film; forming a second insulating film having a lower dielectric constant than that of the gate insulating film at least laterally in the gate length direction of the gate electrode, and on the semiconductor substrate; and implanting a dopant into the substrate through the second insulating film by an ion implantation method to form the source region and the drain region, and allowing the source region and the drain region to extend into the underlying portion of the gate insulating film.

Still further, in order to attain the second object, a method for manufacturing a semiconductor device according to another aspect of the present invention includes the steps of: forming a first insulating film having a higher dielectric constant than that of a silicon dioxide film on a semiconductor substrate, forming a second insulating film having a higher dielectric constant than that of the first insulating film on the first insulating film, and forming a conductive film on the second insulating film; processing the conductive film into a gate electrode; removing the second insulating film so that the part underlying the gate electrode is left, and the end portions of the residual part are positioned inwardly of the end portion on the side on which a source region is to be formed and the end portion on the side on which a drain region is to be formed of the gate electrode, and thereby allowing the residual part to serve as a gate insulating film; and implanting a dopant into the substrate through the first insulating film by an ion implantation method to form the source region and the drain region, and allowing the source region and the drain region to extend into the underlying portion of the gate insulating film.

It is preferable that the insulating film having a higher dielectric constant is formed in amorphous state, and the removal of the insulating film having a higher dielectric constant is partially performed by dry etching, and then further performed by wet etching. Further, it is preferable that the insulating film having a higher dielectric constant is crystallized after wet etching. Still further, the removal of the insulating film having a higher dielectric constant is performed such that the end portions of the residual part are positioned inwardly from the respective end portions on the source region side and on the drain region side of the gate electrode by 15 nm to 25 nm, respectively. The residual part serves as the gate insulating film, and hence each of the end portions thereof has the same meaning as that of each of the end portions of the gate insulating film described above.

The implantation of the dopant can be performed by an oblique ion implantation method. The materials for the gate insulating film and the materials for the gate electrode are the same as described above. Further, it is possible that the gate electrode is a polysilicon, and a plurality of the gate electrodes have mutually different work functions by using different substances for the ion implantation from one gate electrode to another. The preferred materials and the like of the gate insulating film and the gate electrode are the same as described above.

BRIEF DESCRIPTION OF THE DRAWINGS

FIGS. 1A to 1D are views showing the manufacturing process of a semiconductor device of Example 1 of the present invention;

DETAILED DESCRIPTION OF THE PREFERRED EMBODIMENTS

Example 1

Figure 2A:
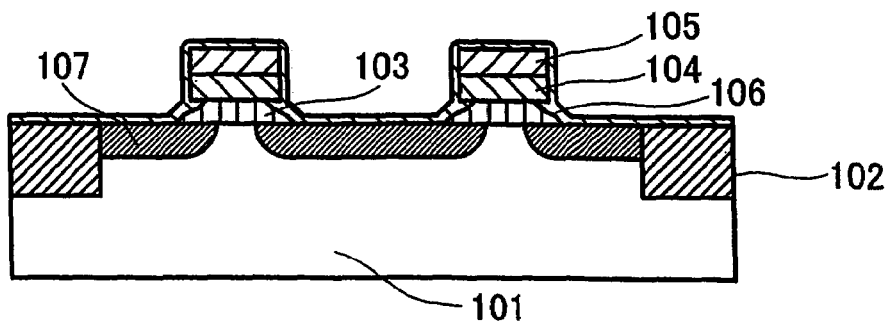
FIGS. 2A to 2C are views showing the manufacturing process of the semiconductor device of Example 1 of the present invention.

Below, an example of the present invention will be described by reference to FIGS. 1A to 1D, and FIGS. 2A to 2C. In a silicon substrate 101 in which a desired impurity profile of a P-, and N-well structure, or the like has been previously formed, a channel-embedded type element isolation region structure 102 is formed by a known technology. Thereafter, the silicon substrate surface is washed, and further, an oxide film on the silicon substrate surface is removed. Subsequently, a titanium oxide 103 which is a high dielectric constant insulating film having a higher dielectric constant than that of a silicon dioxide film, a metal film serving as a gate electrode 104, and a silicon dioxide film 105 which serves as a mask for gate processing are successively formed, resulting in the structure shown in FIG. 1A. The titanium oxide has been formed by a CVD process. At this process, it has been deposited in amorphous state by controlling the formation temperature and the like. Further, as the metal film serving as the gate electrode, there has been used a film formed by depositing a tungsten film with a sputtering method.

Then, the silicon dioxide film 105 and the tungsten film are processed by using conventional lithography and dry etching technologies to form the gate electrode 104. At this step, a part of the titanium oxide film 103 has been also etched due to the characteristics of dry etching. In consequence, the top thereof has been etched inwardly from the end portions in the gate length direction of the gate electrode 104 to obtain the structure of FIG. 1B. At this step, it is so configured that the end portions of the top of the titanium oxide film 103 are positioned inwardly from the respective end portions of the gate electrode 104 by about 15 to 25 nm, respectively. In other words, the gate insulating film exhibits a large action at the thickest site thereof, so that the end portions of this site may be placed at the position described above.

It is also acceptable that dry etching is performed by changing the previously used etching gas into a gas for etching the titanium oxide. However, it is more preferable that the titanium oxide film 103 is removed by wet etching in order to prevent damage to the substrate. In this step, the titanium oxide film 103 has been etched with a mixed solution of hydrofluoric acid, nitric acid, and acetic acid, resulting in the structure shown in FIG. 1C. Incidentally, our study proves as follows. Namely, when the metal oxide film has been crystalized, the wet etching rate becomes extremely low. Therefore, the film is formed in amorphous state at the time of film deposition as described above. Then, after the formation of the structure of FIG. 1C, the deposited film is crystallized by a heat treatment. This process is easier from the viewpoint of the process. Subsequently, a thin silicon dioxide film 106 has been formed by a CVD process (FIG. 1D).

Further, a source/drain region 107 is formed by an ion implantation method and annealing. In this step, it is essential in improving the device characteristics that the boundary between the source/drain region 107 and the channel region underlies the region in which the titanium oxide film 103 which is a high dielectric constant insulating film exists (FIG. 2A).

Figure 2B:
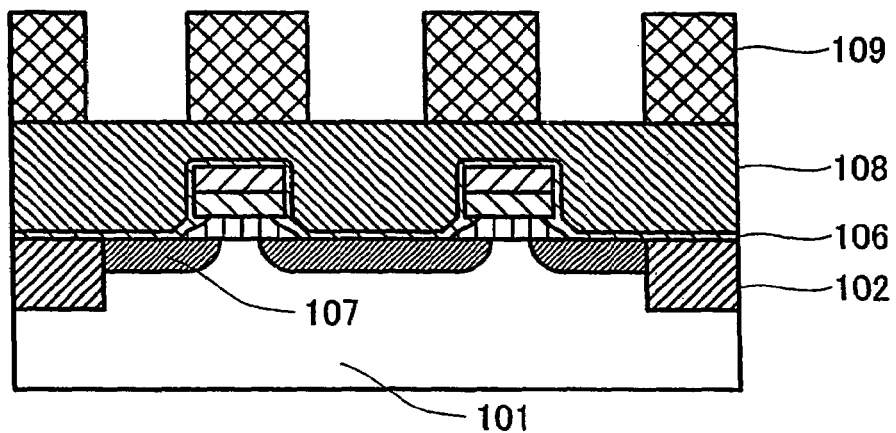
Figure 2C:
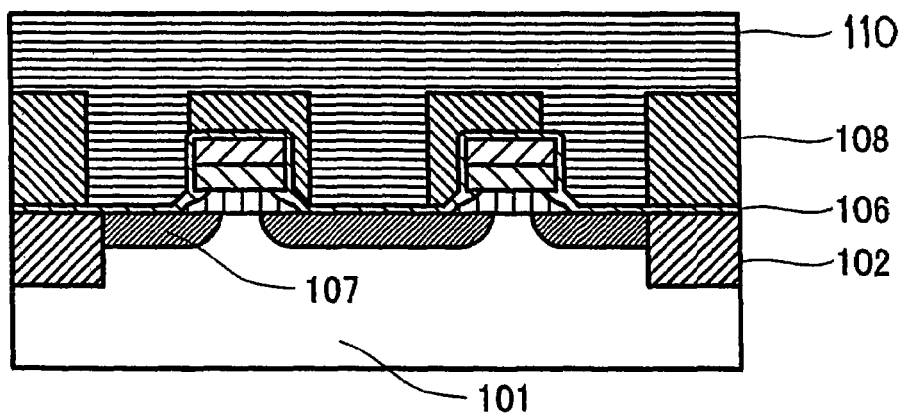

Further, an interlayer insulating film 108 ensuring a relatively high dry etching rate has been deposited by a plasma CVD process, and then the contact region has been patterned with a photoresist 109 by using a lithography process (FIG. 2B). A contact is formed by using the photoresist 109. By using a difference in etching rate between the interlayer insulating film 108 and the silicon dioxide film 106, it is possible to form a contact hole on the source/drain region 107 in a self-aligned manner.

Further, a metal film 110 serving as a wiring layer has been deposited thereon (FIG. 2C), and patterned to form a MISFET structure. The characteristics of the MISFET of this structure have been evaluated. As a result, it has been shown that the MISFET has good device characteristics. Further, it has been also shown that the concentration of the metal constituting the high dielectric constant insulating film contained in the source/drain region 107, i.e., titanium is $10^{11}$ atom/cm$^2$ or less.

Incidentally, in this example, a titanium oxide is used as the high dielectric constant insulating film. However, even when the oxide or the oxynitride of at least one metal selected from the group consisting of titanium, tantalum, hafnium, zirconium, aluminium, lanthanum, and strontium is used, it is possible to obtain the same effect. Further, even when a silicate compound obtained from CVD using the organic metal compound of the aforesaid metal (a plurality of metals are also acceptable), an organic Si compound, and oxygen as a source gas is used, it is possible to obtain the same effect. The silicate compound comprises titanium-Si-oxygen when titanium has been used as the metal.

Further, tungsten is used as the gate electrode. However, even when titanium, molybdenum, or a nitride thereof or a silicide thereof is used, it is possible to obtain the same effect.

With this semiconductor device, if the insulating film having a high dielectric constant is present on the region in which the channel region and the source and drain regions continuous with the channel region overlap with the gate electrode, it is possible to increase the amount of induced charge flowing through the channel region. On the other hand, a high electric field occurs between the gate edges and the source and the drain. Therefore, such a configuration has been adopted that an insulating film having a relatively low dielectric constant such as a silicon dioxide film is disposed at this site. This configuration is effective for reducing the fringe capacitance.

Example 2

Next, a second example of the present invention will be described by reference to FIGS. 3A to 3D, and FIGS. 4A and 4B. In a silicon substrate 201 in which a desired impurity profile has been previously formed, a channel-embedded type element isolation region structure 202 is formed in the same manner as in Example 1. Thereafter, the silicon substrate surface is washed, and further, an oxide film on the silicon substrate surface is removed. Subsequently, a high dielectric constant insulating film having a higher dielectric constant than that of a silicon dioxide film is formed. Herein, the high dielectric constant insulating film has been formed by a plasma CVD process. At this process, zirconium oxide has been used as the high dielectric constant material. The insulating film formed in this case is so configured that a so-called silicate film 203 comprising zirconium-silicon-oxygen having a relatively low dielectric constant (to about 10) is formed on the substrate, and a zirconium oxide 204 is formed thereon. In consequence, it becomes an insulating film of a laminated structure. A tungsten film serving as a gate electrode 205, and a silicon dioxide film 206 serving as a mask for gate processing have been successively formed thereon, resulting in the structure shown in FIG. 3A.

Thereafter, the silicon dioxide film 206 and the tungsten film are processed by using conventional lithography and dry etching technologies to form the gate electrode 205. Further, dry etching is performed by changing the previously used etching gas into a gas for etching the zirconium oxide 204. In consequence, the silicate film 203 is selectively left to obtain the structure of FIG. 3B. Herein, the silicate film 203 is roughly identical in physical properties with the silicon dioxide. Accordingly, it is possible to increase the difference in etching rate with the zirconium oxide film for dry etching, which is advantageous for obtaining the structure of FIG. 3B. Further, the zirconium oxide 204 has been so configured that each end portions thereof are positioned inwardly from the respective end portions in the gate length direction of the gate electrode by about 15 to 25 nm, respectively.

Figure 3A:
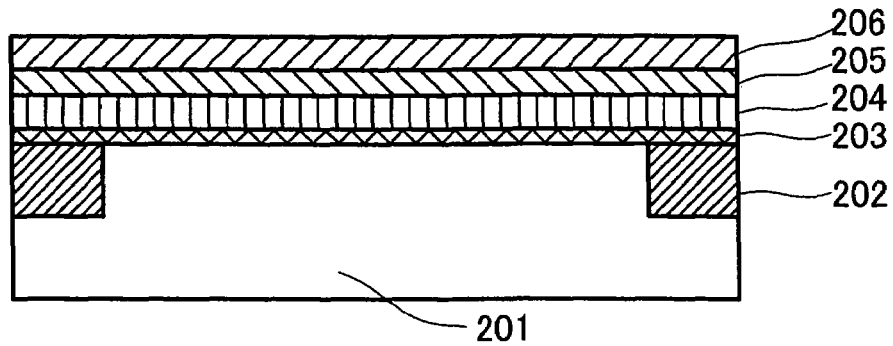
FIGS. 3A to 3C are views showing the manufacturing process of a semiconductor device of Example 2 of the present invention.
Figure 3B:
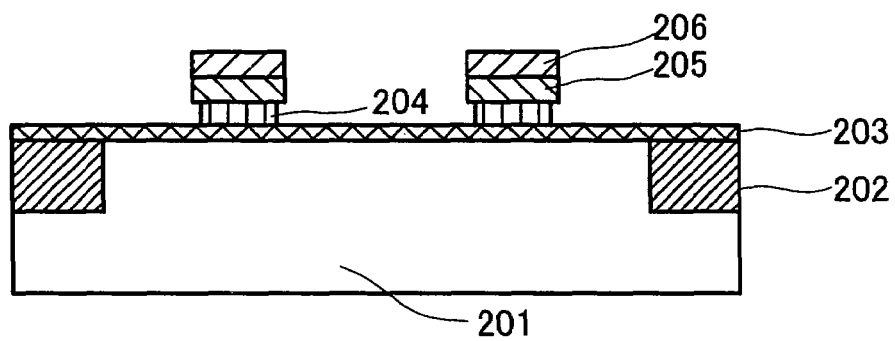
Figure 3C:
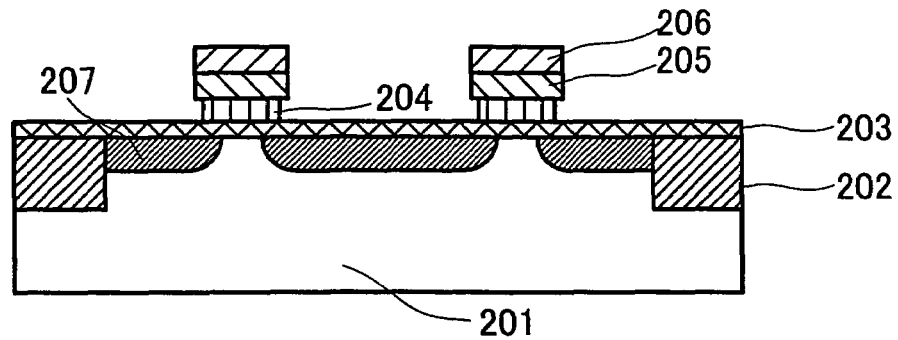

Subsequently, source/drain region 207 is formed by an ion implantation method and annealing. In this step, it is essential in improving the device characteristics that the boundary between the source/drain region 207 and the channel region is allowed to underlie the region in which the zirconium oxide film 204 exists by controlling the ion implantation conditions and the annealing conditions (FIG. 3C).

Incidentally, the concentration of zirconium in the silicate film 203 is several percent, and the amount of zirconium atoms knocked on into the substrate is about $10^{11}$ atom/cm$^2$.

Thus, it is possible to reduce the amount down to 10% or less of the amount in the case of the ion implantation through a zirconium oxide film. Therefore, in this step, intentionally, the through film for ion implantation used in Example 1 is not used.

Figure 4A:
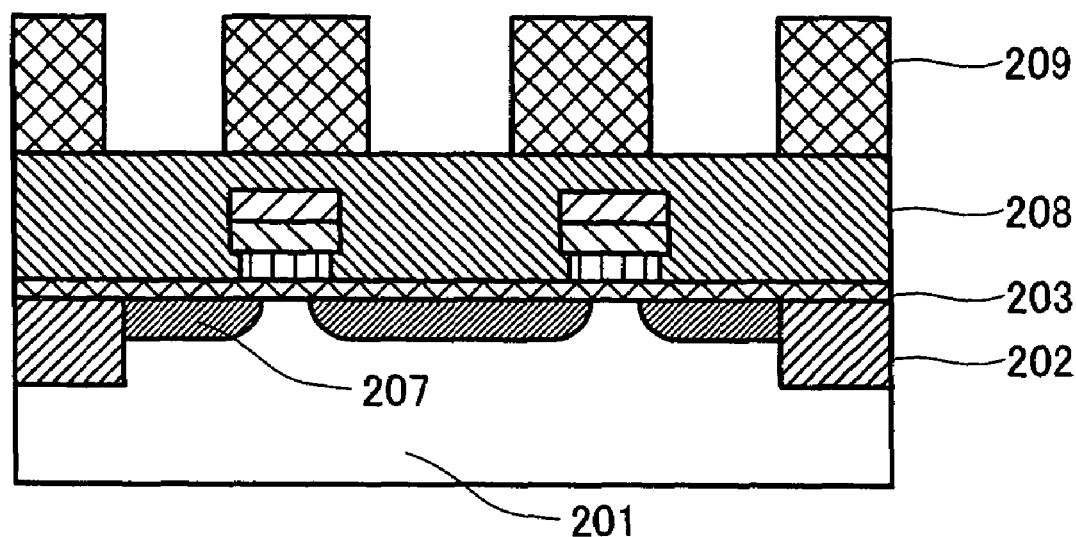
FIGS. 4A and 4B are views showing the manufacturing process of the semiconductor device of Example 2 of the present invention.
Figure 4B:
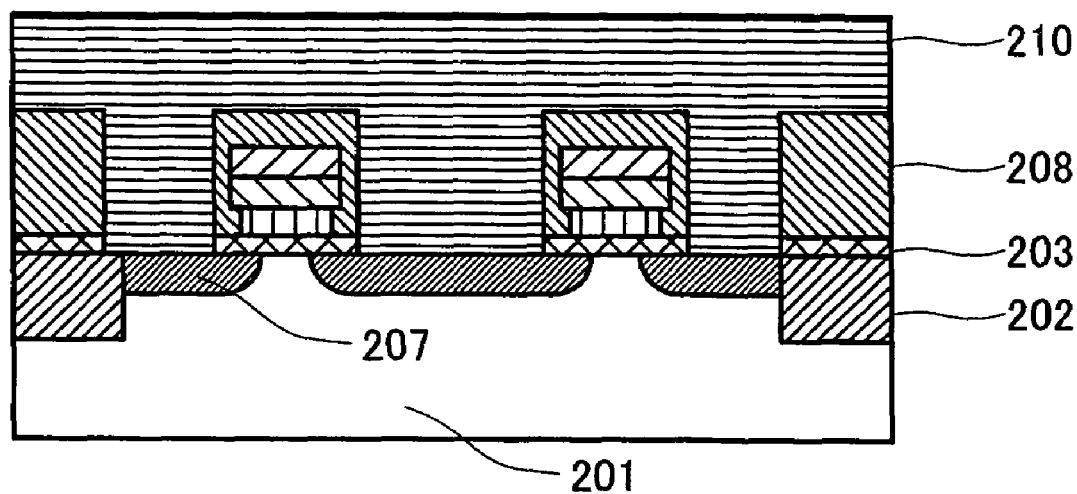

Further, an interlayer insulating film 208 ensuring a relatively high dry etching rate has been deposited by a plasma CVD process, and then the contact region has been patterned with a photoresist 209 by using a lithography process (FIG. 4A). A contact has been formed by using the photoresist 209 as a mask, and a metal film 210 serving as a wiring layer has been deposited thereon (FIG. 4B), and patterned to form a MISFET structure.

Figure 5:
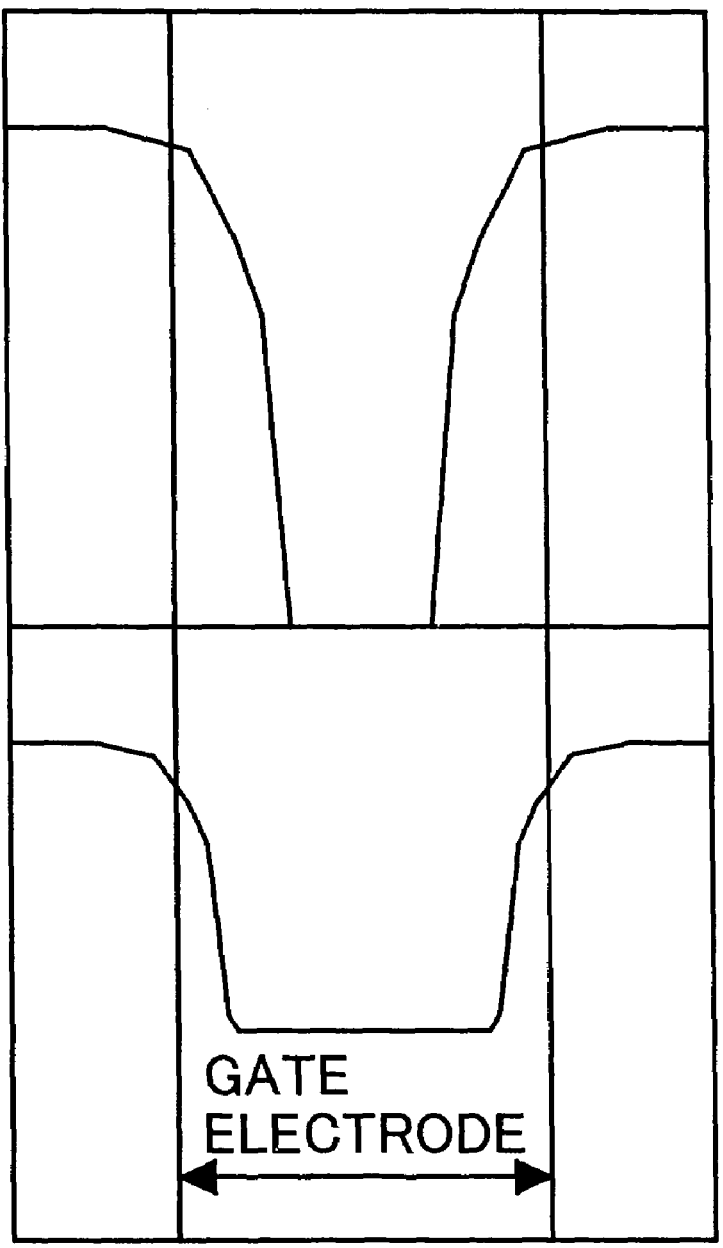
FIG. 5 is a diagram showing the relationship between the equivalent thickness and the impurity concentration of a gate insulating film in the channel direction for illustrating the present invention.

Herein, FIG. 5 shows the relationship between the equivalent thickness (the insulating film thickness in terms of the dielectric constant of the silicon dioxide film) and the impurity concentration of the gate insulating film in the channel direction. Thus, it is possible to sufficiently perform the induction of charge, and increase the channel current due to the fact that the site with a small equivalent thickness overlies the source/drain region connected to the channel region. On the other hand, by increasing the equivalent thickness on a region other than the aforesaid region, it is possible to resultantly improve the operation speed of the device without increasing the fringe capacitance.

The characteristics of the MISFET of this structure have been evaluated. As a result, it has been shown that the MISFET has good device characteristics.

Incidentally, in this example, zirconium oxide is used as the high dielectric constant insulating film. However, even when the oxide or the oxynitride of at least one metal selected from the group consisting of titanium, tantalum, hafnium, zirconium, aluminium, lanthanum, and strontium is used, it is possible to obtain the same effect.

Further, for the gate electrode, tungsten is used. However, even when titanium, molybdenum, or a nitride or silicide thereof is used, it is possible to obtain the same effect.

Example 3

Further, a third example of the present invention will be described by reference to FIGS. 6A to 6C, and FIGS. 7A to 7C. In this example, a plurality of MISFETs are formed, and both of P-type channel and N-type channel MISFETs are formed. Therefore, a polysilicon is used for the gate electrode material. A P-, or B-doped polysilicon is used as a gate electrode according to a MISFET, so that the work function varies from one gate electrode to another.

In a silicon substrate 301 in which a desired impurity profile has been previously formed, a channel-embedded type element isolation region structure 302 is formed in the same manner as in Example 1. Thereafter, the silicon substrate surface is washed, and further, an oxide film on the silicon substrate surface is removed. Subsequently, a high dielectric constant insulating film having a higher dielectric constant than that of a silicon dioxide film is formed. Herein, the high dielectric constant insulating film has been formed by a plasma CVD process. At this process, a zirconium oxide has been used as the high dielectric constant material. The insulating film formed in this case is so configured that a so-called silicate film 303 comprising zirconium-silicon-oxygen having a relatively low dielectric constant (to about 10) is formed on the substrate, and a zirconium oxide 304 is formed thereon. In consequence, it becomes an insulating film of a laminated structure. A polysilicon film serving as a gate electrode 305 is formed thereon as described above, and P or B is introduced thereinto by the ion implantation method. An appropriate annealing is performed, and then, a silicon dioxide film 306 serving as a mask for gate processing is successively formed, resulting in the structure shown in FIG. 6A.

Thereafter, the silicon dioxide film 306 and the P-, or B-doped polysilicon film are processed by using conventional lithography and dry etching technologies to form the gate electrode 305. Further, dry etching is performed by changing the previously used etching gas into a gas for etching the zirconium oxide 304. In consequence, the silicate film 303 is selectively left to obtain the same structure as that of FIG. 3B shown in the second example. Subsequently, by using a wet etching technology with a hydrofluoric acid, the silicate film 303 is removed so that the portion of the silicate film 303 underlying the gate electrode is partly left, resulting in the structure of FIG. 6B. Herein, the silicate film 303 has been so configured that the end portions thereof are positioned inwardly from the respective end portions in the gate length direction of the gate electrode 305 by about 15 to 25 nm, respectively.

Figure 6A:
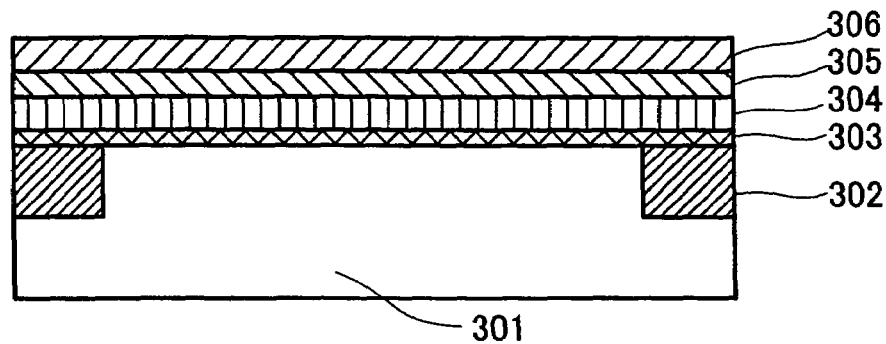
FIGS. 6A to 6C are views showing the manufacturing process of a semiconductor device of Example 3 of the present invention.
Figure 6B:
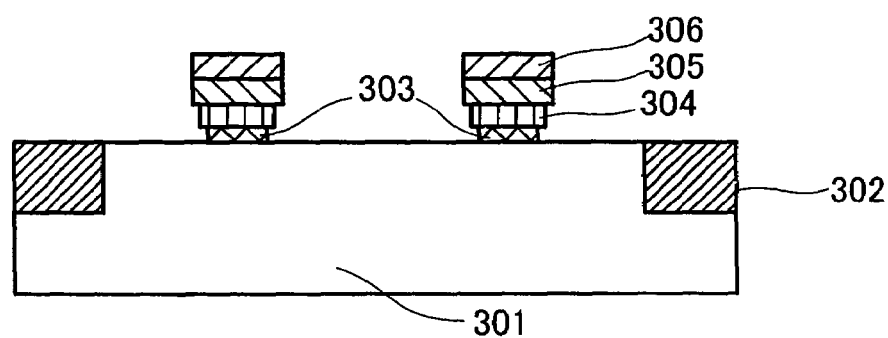
Figure 6C:
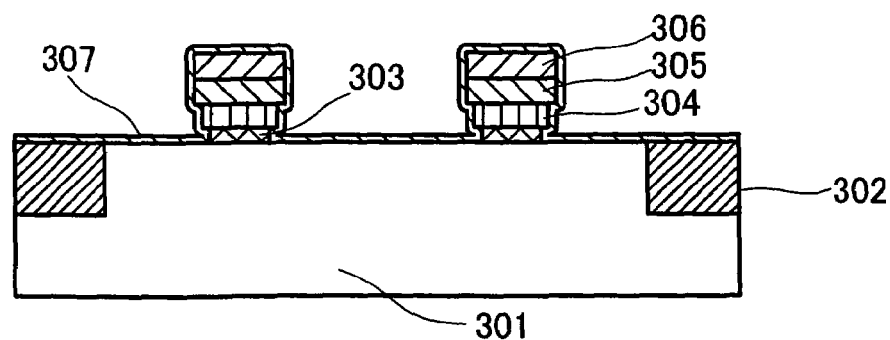

Thereafter, a silicon dioxide film 307 is formed as a through film for ion implantation by the CVD method. The profile is shown in FIG. 6C. Herein, the diffusion layer serving as source/drain is made shallow in order to improve the short channel characteristics. To that end, the implantation energy for ion implantation is also set at a small value, i.e., 2 KeV. For that reason, the thickness of the through film is also set at a small value, i.e., 5 nm. Therefore, as shown in FIG. 6C, the gate electrode side is so configured as to have a depression of about 10 to 20 nm in the underlying portion of the gate electrode even after the formation of the through film.

Herein, in order to form a shallow diffusion layer, and cause overlap between the source/drain region and the region having a very small equivalent thickness, an oblique ion implantation technique is used in this example. In this step, by setting the implantation angle at 30 degrees, the source/drain region is allowed to reach the region with a small equivalent thickness underlying the gate.

Figure 7A:
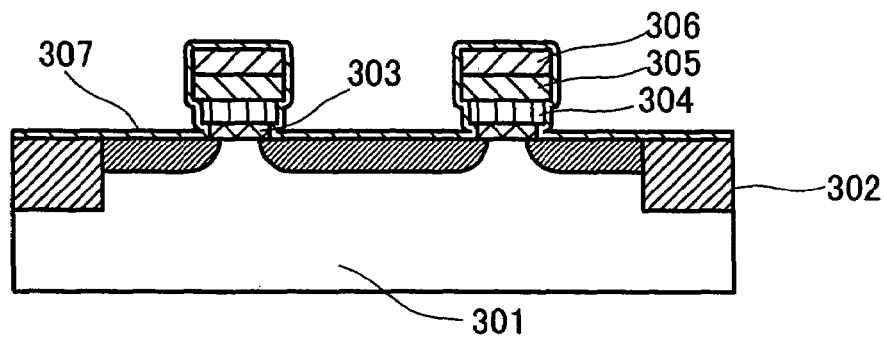
FIGS. 7A to 7C are views showing the manufacturing process of the semiconductor device of Example 3 of the present invention.

The source/drain region has been formed as shown in FIG. 7A by the oblique ion implantation method and annealing. In order to advantageously cause overlap between the source/drain region and the site of the gate insulating film, having a very small equivalent thickness in this manner, the control of the depression in the gate sidewall portion described above is also an effective means. Further, it has been shown that the concentration of the metal constituting the high dielectric constant insulating film, i.e., zirconium contained in the source/drain region is $10^{11}$ atom/cm$^2$ or less.

Figure 7B:
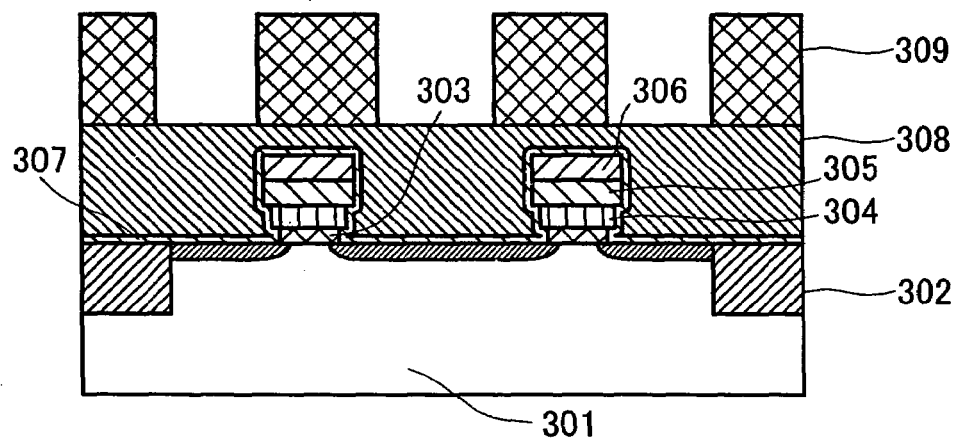
Figure 7C:
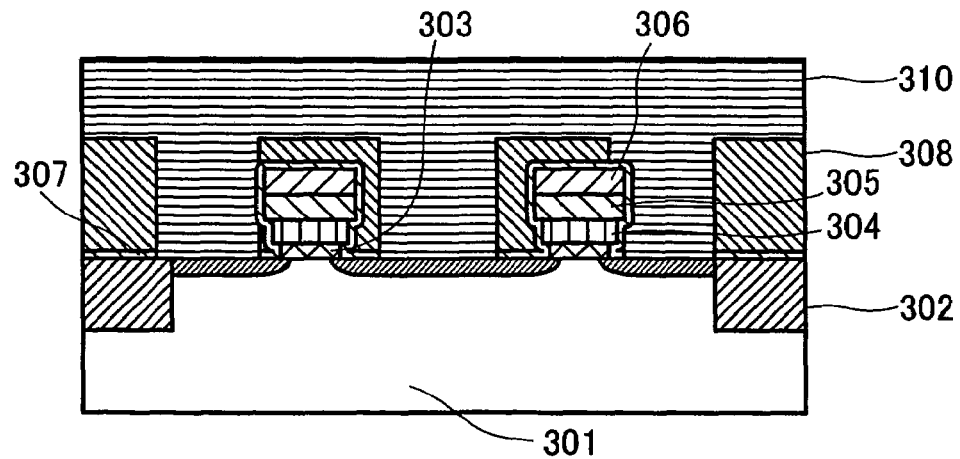

Further, an interlayer insulating film 308 ensuring a relatively high dry etching rate has been deposited by a plasma CVD process, and then the contact region has been patterned with a photoresist 309 by using a lithography process (FIG. 7B). A contact has been formed by using the photoresist 309 as a mask, and a metal film 310 serving as a wiring layer has been deposited thereon (FIG. 7C), and patterned to form a MISFET structure. Incidentally, in this step, a contact hole is formed in a self-aligned manner by using a difference in dry etching rate between the interlayer insulating film 308 and the silicon dioxide film 307 which is a through film in the same manner as in the first example.

The characteristics of the MISFET of this structure have been evaluated. As a result, it has been shown that the MISFET has good device characteristics, i.e., it is excellent in short channel characteristics, and driving current.

Incidentally, in this example, a zirconium oxide is used as the high dielectric constant insulating film. However, even when the oxide or the oxynitride of at least one metal selected from the group consisting of titanium, tantalum, hafnium, zirconium, aluminium, lanthanum, and strontium is used, it is possible to obtain the same effect.

Further, for the gate electrode, tungsten is used. However, even when titanium, molybdenum, or a nitride or silicide thereof is used, it is possible to obtain the same effect.

According to the present invention, it is possible to increase the speed of a MISFET device. Further, it is possible to avoid the contamination of a silicon substrate due to the incorporation of a metallic element thereinto, and an increase in fringe capacitance.

What is claimed is:

1. A semiconductor device having a semiconductor substrate and a field effect transistor formed on said semiconductor substrate, said field effect transistor comprising source and drain regions formed in said semiconductor substrate, a gate insulating film formed on said semiconductor substrate, and a gate electrode disposed on said gate insulating film, said gate insulating film being a first insulating film having a higher dielectric constant than that of a silicon dioxide film, and having a laminated structure of a first layer comprising a compound of metal and oxygen, and a second layer comprising a compound of metal, oxygen and silicon, said first layer being arranged between said gate electrode and said second layer, and the end portions in the gate length direction of said first layer being positioned inwardly from the end portions of said gate electrode, the end portions in the gate length direction of said second layer being positioned inwardly from said end portions of said gate electrode and inwardly from said end portions of said first layer, and said end portions of said first layer and said end portions of said second layer being positioned in a region in which said gate electrode overlaps with said source and drain regions in a plan configuration.

2. The semiconductor device according to claim 1, wherein an second insulating film having a lower dielectric constant than that of said gate insulating film is provided laterally of the end portions in the gate length direction of said gate insulating film, and between said gate electrode and said source and drain regions.

3. The semiconductor device according to claim 1, wherein said end portions of said second layer are positioned inwardly from said end portions of said gate electrode by 15 nm to 25 nm, respectively.

4. The semiconductor device according to claim 1, wherein said first layer is comprised of an oxide of at least one metal selected from the group consisting of titanium, tantalum, hafnium, zirconium, aluminum, lanthanum, and strontium, and said second layer is comprised of a silicate compound of at least one metal selected from said group.

5. The semiconductor device according to claim 1, wherein said gate electrode is a metal selected from at least one selected from the group consisting of tungsten, titanium, and molybdenum, or a nitride thereof or a silicide thereof.

* * * * *

UNITED STATES PATENT AND TRADEMARK OFFICE
CERTIFICATE OF CORRECTION

PATENT NO. : 7,064,400 B2
APPLICATION NO. : 11/000992
DATED : June 20, 2006
INVENTOR(S) : J. Yugami et al.

It is certified that error appears in the above-identified patent and that said Letters Patent is hereby corrected as shown below:

Title page, item (30) should read
--(30)   Foreign Application Priority Data

Dec. 11, 2000   (JP)…………………….....2000-375610--

Signed and Sealed this

First Day of May, 2007

JON W. DUDAS
*Director of the United States Patent and Trademark Office*